(12) United States Patent
Sloane

(10) Patent No.: US 9,125,301 B2
(45) Date of Patent: Sep. 1, 2015

(54) INTEGRAL HEATER ASSEMBLY AND METHOD FOR CARRIER OR HOST BOARD OF ELECTRONIC PACKAGE ASSEMBLY

(75) Inventor: Jeffrey Sloane, San Diego, CA (US)

(73) Assignee: Integrated Microwave Corporation, San Diego, CA (US)

( * ) Notice: Subject to any disclaimer, the term of this patent is extended or adjusted under 35 U.S.C. 154(b) by 964 days.

(21) Appl. No.: 13/275,559

(22) Filed: Oct. 18, 2011

(65) Prior Publication Data

US 2013/0094148 A1 Apr. 18, 2013

(51) Int. Cl.
*H05K 3/34* (2006.01)
*H05K 7/20* (2006.01)
*H05K 1/02* (2006.01)
*H05K 1/14* (2006.01)
*H05K 1/16* (2006.01)
*H05K 3/22* (2006.01)

(52) U.S. Cl.
CPC ............ *H05K 1/0212* (2013.01); *H05K 3/3494* (2013.01); *H05K 1/141* (2013.01); *H05K 1/167* (2013.01); *H05K 3/22* (2013.01); *H05K 2203/176* (2013.01); *Y10T 29/49821* (2015.01)

(58) Field of Classification Search
CPC ... H05K 1/0212; H05K 1/141; H05K 3/3494; H05K 2203/176
USPC .......... 361/782; 257/700; 219/209; 29/426.4, 29/426.1, 402.03, 840
See application file for complete search history.

(56) References Cited

U.S. PATENT DOCUMENTS

| | | | |
|---|---|---|---|
| 4,561,006 A | 12/1985 | Currie | |
| 4,769,525 A | 9/1988 | Leatham | |
| 5,010,233 A | 4/1991 | Henschen et al. | |
| 5,859,407 A | 1/1999 | Saiki et al. | |
| 6,031,729 A | 2/2000 | Berkely et al. | |
| 6,396,706 B1 | 5/2002 | Wohlfarth | |
| 6,423,939 B1 | 7/2002 | Pan | |
| 6,426,484 B1 | 7/2002 | Hembree et al. | |
| 6,492,620 B1 | 12/2002 | Lau | |
| 6,541,736 B1 | 4/2003 | Huang et al. | |
| 6,911,624 B2 | 6/2005 | Koopmans | |
| 7,234,218 B2 | 6/2007 | Farooq et al. | |
| 7,449,773 B2 | 11/2008 | Tarn | |
| 7,692,291 B2 | 4/2010 | Moon et al. | |

*Primary Examiner* — Ramon Barrera
(74) *Attorney, Agent, or Firm* — Procopio Cory Hargreaves & Savitch LLP

(57) ABSTRACT

A multilayer printed circuit board has an embedded heater layer having at least one elongated heater element trace of copper which is densely arranged in a predetermined circuitous path over at least part of the area of the board. The heater element has inputs configured for connection to a standard high current, low voltage power supply, and may also have ground connections for selective connection to a ground layer. The heater layer may be embedded in a carrier board of a surface mount module close to the lower solder interface layer, or may be embedded in a host board of an electronics assembly close to the mounting surface.

12 Claims, 7 Drawing Sheets

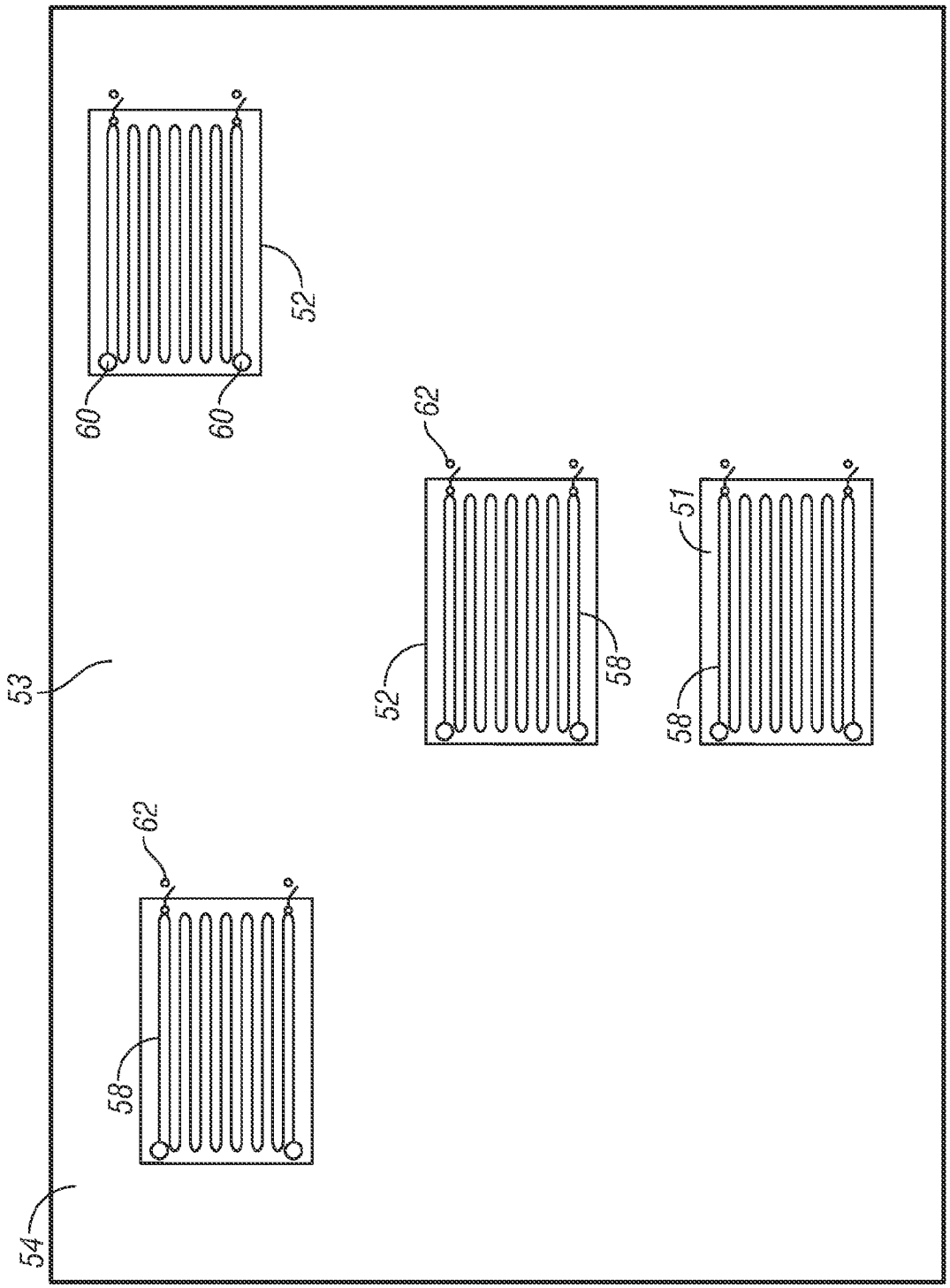

INTEGRAL HEATER ASSEMBLY AND METHOD FOR CARRIER OR HOST BOARD OF ELECTRONIC PACKAGE ASSEMBLY

BACKGROUND

1. Field of the Invention

The present invention relates generally to surface mount technology (SMT) as used in manufacture of electronic products, and is particularly concerned with electronic package assemblies comprising surface mount components and/or subassemblies (SMT devices), and with integral heater assemblies and methods for heating solder layers securing SMT devices to allow removal from host boards.

2. Related Art

The trend in electronics packaging is to eliminate discrete or separate electronic components and make assemblies smaller by relying on very large scale integration (VLSI) integrated circuits or electronic modules. This allows designers of printed circuit assemblies and products to purchase a module for a particular desired function from a manufacturer, without having to design a circuit to perform the function and in a very compact form. In a module, several chips or other components are usually present in a miniaturized form. For example, a module might include a complete intermediate frequency (IF) strip, a voltage controlled oscillator (VCO), a global positioning system (GPS) receiver, a cell phone transceiver, or some other complete assembly.

Modules are relatively expensive, high value devices, and are frequently printed circuit board or PCB based, in other words the assembly is based on a carrier board, which serves as a substrate to hold the internal components and also provides a metallized mounting plane or solder interface layer, and can be thought of as a "module" which is in turn soldered to a host board which is larger than the module and may host many other components and modules. Traditionally, all the components are mounted to a host board using surface mount technology (SMT) construction techniques. Designers of host boards leave little space around the modules in an attempt to miniaturize the product, or leave space for other devices on the board. Currently, such products are getting smaller and space constraints are increasing.

SMT modules can be particularly difficult to remove from the host board. Removal might be required to facilitate troubleshooting, or to replace defective modules. Sometimes, defective modules are returned to the manufacturer for warranty service or credit. During installation of SMT modules and other components onto a host board, the entire host board is heated to reflow solder paste on top of the host board and under the SMT modules. In order to remove an individual module from the board after installation, it is desirable to heat only a selected portion of the host board, but that is rarely possible. All of the solder under a given SMT module must re-flow simultaneously in order to remove it. Heating the entire host-board assembly past the solder reflow temperature jeopardizes the quality of the unit by wasting valuable component termination leach life, degrading solder quality. In some cases, heating the entire board is not even possible because a secondary re-flow to facilitate replacement of a single component or module will cause other components to become damaged or to fall off. Some companies offer local heat systems, usually based on hot air, such as the Hakko 850 SMT Rework Station hot air nozzle, manufactured by American Hakko Products, Inc. of Valencia, Calif. Such systems do not work well with large modules or modules with poor thermal conductivity from top to mounting plane. The hot air temperatures necessary to reflow the solder which is under the module usually damages the components inside. Typical temperatures required for solder reflow are generally of the order of 183° C. to 240° C. (higher temperatures being associated with lead-free solders), and in order to reach this temperature under a module, the heat source must be considerably hotter, particularly in view of heat drains in the module causing convective and conductive heat losses. The hot air stream used for module removal can be as hot as 700° C.

Many SMT modules are very conservatively rated with respect to temperature exposure. For example, standard (non lead-free) ceramic microwave filter modules from Integrated Microwave Corp. (IMC) of San Diego, Calif. are rated to 215° C., which prevents filter module removal without damage to the filter itself. It is rare that a filter module that has already been installed can be removed undamaged. Hot air at 215° C. cannot overcome the thermal masses and losses associated with a typical mounting configuration and still reflow solder under the module, which probably melts at 183 C or higher, and therefore the module cannot be removed without damage. Even preheating the host board to assist in overcoming these losses, which is the most successful tactic, rarely produces the desired result and usually results in damage to one or more modules which were previously surface mounted on the board.

Reinstallation of a module is also rarely possible using current state of the art techniques. Frequently, a manufacturer will cheat and use a soldering iron to re-install a module. The result is a solder joint around only the periphery of the module, and no solder reflow underneath. The resulting air gaps under the module degrade thermal performance, degrade RF performance, provide inferior mechanical strength, and are generally known to be undesirable. In RF filter module installations above approximately 300 MHz, this practice is particularly detrimental and degrades return loss (VSWR) and rejection (attenuation of undesired RF energy) as a result. Some solder process engineers ban the practice of using a soldering iron for module re-installation for these reasons.

Another common option for module removal is use of a so-called "hot shoe". Basically, a hot branding iron or shoe is placed on the board next to the device to be removed, which may be a module or individual component. The shape of the iron is selected to fit in the allowable space. It is part of an effort to heat the solder under the device, rather than the device itself. The shoe makes contact with the peripheral space immediately surrounding the module, and requires exposed solder for contact. There are many limitations to hot shoe technology. For example, the shoe must have the right shape, and there has to be space for it to fit around the device, and a space for the device to occupy without contacting the shoe. This means that custom parts need custom shoes. Reinstallation of modules or components using this technique is very difficult or impossible. Host board damage is likely. The shoe must be very hot, like a soldering iron (600-700° F.). For large mass modules, the time needed for module removal makes host board damage inevitable. For large area modules, the technique does not work at all because reflow cannot be achieved near the center of the module, and therefore it cannot be removed.

Some attempts have been made to overcome the problems in removing or reworking multi-chip modules (MCMs) from a larger printed circuit board using known removal techniques, such as heat guns. An MCM typically has a multi-layer substrate of high temperature, co-fired ceramic. U.S. Pat. No. 6,031,729 of Berkely describes providing multiple side-by-side electrical heaters on the lower layer of a multi-chip module (MCM) having a multi-layer substrate of high temperature, co-fired ceramic. The heaters are formed by a plurality of resistive tungsten metal traces. Tungsten metal is selected in this case because it is compatible with the high firing temperatures inherent in ceramic substrate fabrication, and Berkely states that this material can be tailored to produce the required resistance for heater elements. The technique described in this patent is limited to MCMs with ceramic substrates and printed wiring of tungsten or like materials having lossy characteristics akin to that of tungsten. Tungsten is a high resistance, exotic material and is both expensive and difficult to process. Traditional epoxy-glass circuit board materials (such as FR-4) are not available clad with tungsten, and the addition of tungsten would make production and processing virtually impossible.

The known heating methods involving multiple heater elements are not applicable to many types of electronic components including larger scale surface mount modules.

SUMMARY

Embodiments described herein provide for a heater assembly and method for zone-selective surface mount assembly and removal which allows a select portion of the host board to be reflowed without reflowing adjacent areas of the host board.

According to one aspect, a multilayer printed circuit carrier board for a surface mount (SMT) device or module has a metallized lower surface layer or solder interface layer and is configured for mounting on a host board. The carrier board has an embedded heater layer having at least one elongate heater element of copper arranged in a predetermined circuitous or meandering path over at least part of the area of the carrier board. The heater element has inputs configured for connection to a standard low voltage/high current power supply, and may also have ground connections for selective connection to a common ground layer. The heater layer is embedded close to the lower solder layer of the carrier board, with a first dielectric layer between the heater layer and solder layer, and a second dielectric layer between the heater layer and next layer of the circuit board. These first and second dielectric layers isolate the heater element from other circuit nodes.

The use of a copper metal trace for the heater element has the advantage over tungsten that it is easy to process and of low cost. However, copper is of relatively low resistance. By forming the heater element from a relatively thin trace of copper in a circuitous or meandering path, which may be serpentine, zig-zag, spiral or of other meandering or circuitous shapes, the heater element has as much length as possible in the desired heating area, increasing the resistance. The heater element is connected to a low voltage, high current power supply in order to provide sufficient power, and thus sufficient heat to melt the solder layer affixing the surface mount module to a host board, allowing the surface mount module to be removed from the host board. Prior art does not consider the use of copper heating elements because traditionally, high resistance materials are used to make resistance heater structures. But the use of low voltages and higher currents allows copper to perform well as a heater element. The presence of copper as the "standard" conductive material for printed circuit boards makes its use very economical and practical.

According to another aspect, the host board of an electronics assembly carrying a plurality of multi-component electronics modules or SMT devices has multiple heater elements at predetermined locations or heater zones in the board corresponding to the mounting positions of one or more SMT devices. The heater elements are provided in a heater layer just beneath the upper layer of the host board, separated by a thin dielectric layer from the upper layer, and each heater element comprises a single elongate heater element of conductive material arranged in a circuitous or meandering path extending across a respective heater zone or area of the heater layer. The remainder of the heater layer may comprise a ground plane or other circuitry, and the heater elements may be designed to be connected electrically to the ground plane when not in use as a heater. Dielectric layers are also provided between the heater layer and the next adjacent layers of the host board on each side of the heater layer. Suitable accessible inputs for connecting respective heater elements to a power supply along with switches for connecting selected heater elements to the ground plane are provided on the host board, for example at the edge of the board. The positions of the heater zones are determined based on the desired mounting locations of surface mount modules or components which may need to be removed from the board and which may be damaged if removed using standard techniques.

Each heater element in the host board is of highly conductive metal such as copper and is connected to a low voltage, high current power supply in order to provide sufficient heat to melt a solder layer of a surface mount module or device affixing the surface mount module to the host board above the heater layer, allowing the module to be removed from the host board. Other suitable highly conductive metals for the heater element are gold or silver, but these are more expensive than copper. Only a small amount of voltage drop across the heater is needed, because the current from the power supply is high. The recommended power supply is a low voltage, high-current switching power supply that uses internal PWM for regulation, and can be further controlled using pulses that change the duty cycle of the output from 1% to 100%. The amount of current needed varies with the design of the heater and the amount of heat needed.

According to another aspect, a method of removing a surface mount module from a host board of an electronics assembly carrying other electronic components is provided, which comprises heating the entire assembly in an oven to a temperature lower than the solder reflow temperature and energizing a heater element in a heater layer of the surface mount module with a low voltage/high current power supply for a sufficient length of time to raise the temperature of the solder layer of the surface mount module to the solder reflow temperature, removing the module from the host board, and then disconnecting the heater element from the power supply. The oven heating may be concurrent with the application of current to the heater element, or the assembly may be heated in the oven prior to application of current to the heater element.

With this method, the heater element does not have to heat the solder element from ambient temperature to the solder reflow temperature, which could take a long time if the module is large or the solder reflow temperature is high. The heater element generates enough heat to raise the temperature of the solder layer of the module sufficiently to melt the solder layer in a relatively short time, due to the pre-heating or concurrent oven heating of the assembly. The pre-heating or oven heating of the entire host-board raises the overall temperature of the assembly to a lower temperature which is close to, but below the solder reflow temperature, to reduce or eliminate the risk of damage to other components or modules on the board or loosening the solder connection of such devices so that they fall off the board. Using the oven reduces the amount of heat which must be generated by the heater element, which may be restricted by design parameters in some designs.

Where lower solder reflow temperatures or smaller, lower mass modules are involved, requiring less energy to raise to the solder reflow temperature, the oven heating step may be eliminated and the heater element may be used to heat the solder layer from ambient temperature (25 C) to the solder reflow temperature.

Other features and advantages of the present invention will become more readily apparent to those of ordinary skill in the art after reviewing the following detailed description and accompanying drawings.

BRIEF DESCRIPTION OF THE DRAWINGS

The details of the present invention, both as to its structure and operation, may be gleaned in part by study of the accompanying drawings, in which like reference numerals refer to like parts, and in which:

FIG. 10 is a plan view of one embodiment of the heater layer of FIG. 9.

DETAILED DESCRIPTION

Certain embodiments as disclosed herein provide for a surface mount assembly in which a heater layer is embedded in one or more surface mount modules each having a carrier board holding internal components and a metallized mounting plane or solder interface layer. In another embodiment, a heater layer with plural heater zones is embedded in a host board on which multiple surface mount modules are mounted.

After reading this description it will become apparent to one skilled in the art how to implement the invention in various alternative embodiments and alternative applications. However, although various embodiments will be described herein, it is understood that these embodiments are presented by way of example only, and not limitation. As such, this detailed description of various alternative embodiments should not be construed to limit the scope or breadth of the present invention.

In the following description, the term "dielectric layer" means a layer of dielectric or non-conductive material of the type that is conventionally used for standard non-metal layers of circuit boards.

Figure 1:
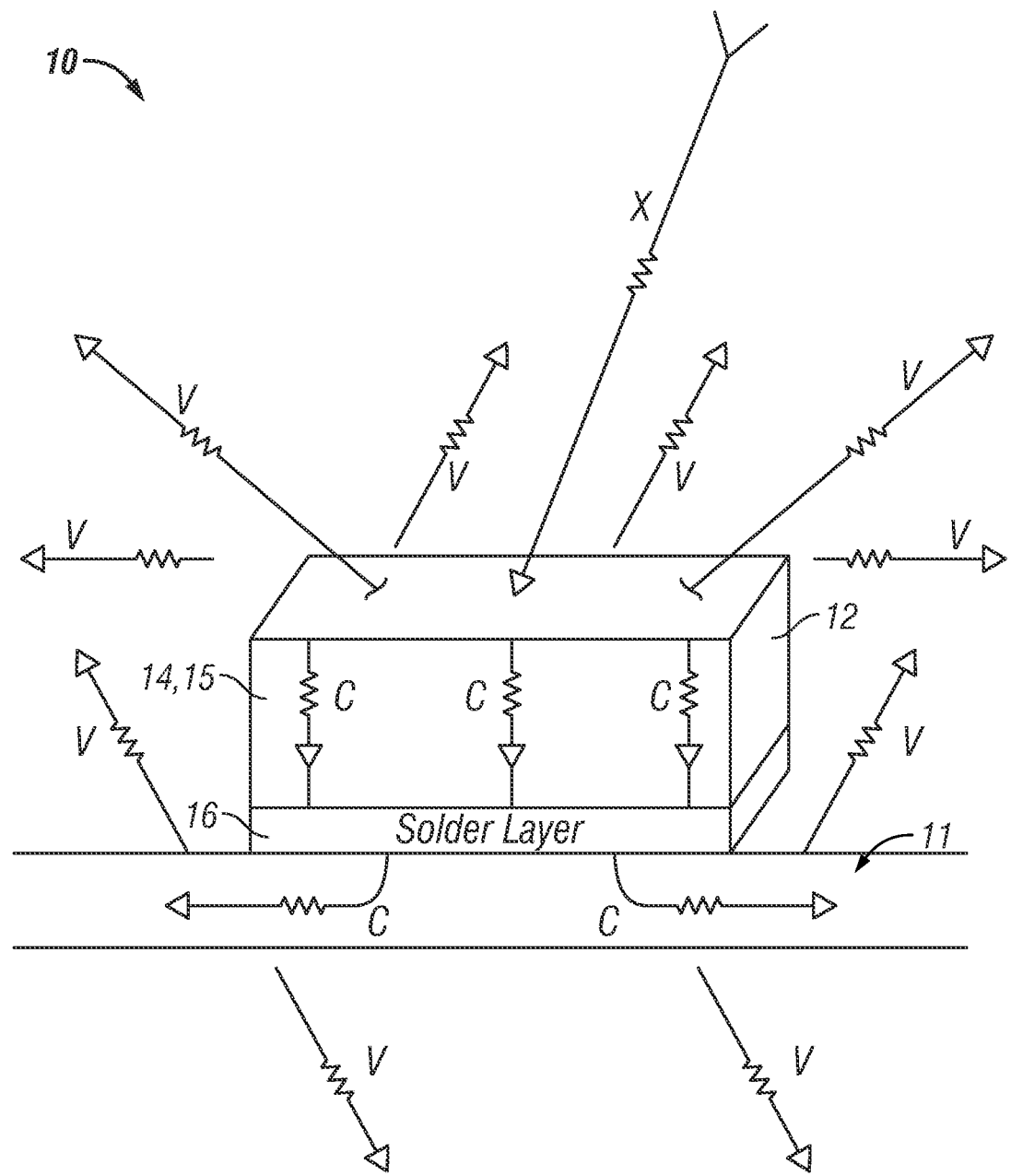
FIG. 1 illustrates a prior art method of heating a component on a board with a hot air input from a nozzle or hot air gun, showing the conductive and convective heat losses from the module.
Figure 2:
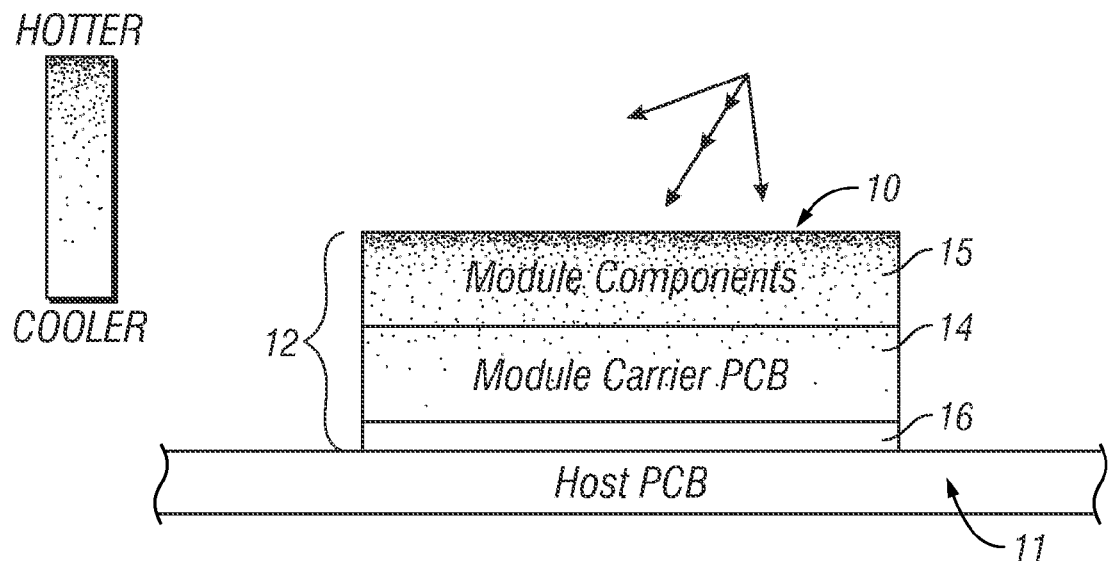
FIG. 2 is a side view of a prior art surface mount component or module mounted on a host board, illustrating heating by a hot air nozzle.

FIGS. 1 and 2 illustrate a prior art surface mount assembly 10. Assembly 10 comprises a host board 11 on which one or more electronic modules or multilayer printed circuit boards 12 are mounted. The prior art electronic module or surface mount technology (SMT) module 12 has a carrier board 14 which holds a plurality of components 15 and a lower, metallized mounting plane or solder interface layer 16 which is soldered to the host board 11. Typically, a host board carries multiple individual components and modules. The electronic module 12 is a complete package which carries out a complete or substantially complete function, such as a various types of filter and resonator functions, avoiding the need to mount separate, individual components on a host board to provide such functions.

When a module 12 is to be removed from the board, for example for replacement if faulty or damaged, the prior art removal method is typically to apply heat to the module, for example a hot air input represented by vector X in FIG. 1. The hot air input is provided from a hot air blower or nozzle. The hot air temperatures necessary to reflow the solder under the module usually damage the components inside the module, causing problems when a module is returned to the manufacturer for troubleshooting, warranty service or credit. As illustrated in FIG. 1, application of heat (vector X) from above results in significant convective heat losses (represented by vectors V in FIG. 1), as well as conductive heat losses (represented by vectors C in FIG. 1) from the module to the host board. FIG. 2 illustrates the heat gradients resulting from heat gun application as a dot density, with hotter regions having more dots. The heat drains of FIG. 1 work against the solder heating and mean that the hot air temperatures needed to reflow solder under the module are significantly higher than the solder reflow temperature (around 183 degrees Centigrade), and are often higher than the temperature rating of the module itself. For example, ceramic microwave filter modules may be rated only to temperatures of the order of 215° C., which prevents filter removal by heating from above without significant damage to the filter itself. Hot air at 215° C. cannot overcome the thermal masses and losses associated with a typical mounting configuration, and the module therefore cannot be removed without damage. It is therefore very rare that a filter module that has already been installed and is returned to a manufacturer under warranty is undamaged.

The alternative option of pre-heating the host board past the solder reflow temperature may still result in damage to one or more components or modules on the board, and jeopardizes quality by wasting valuable component leach life, degrading solder quality. In some cases, a secondary reflow to facilitate replacement of a module causes module components to be damaged or fall off. These alternatives also do not work well with modules with poor thermal conductivity or large modules.

FIGS. 3 to 7 illustrate a first embodiment of a surface mount module or device 20 configured for mounting on a host board 22, along with other modules and components (not illustrated) in a surface mount assembly. The module is based on a multilayer carrier board on which one or more electronic components 25 are surface mounted in a known manner, as illustrated schematically in FIG. 3. The multi-layer carrier board includes a lower, solder interface layer 26 and a heater layer 28 embedded in the carrier board above solder interface layer 26, as well as additional layers as illustrated in the exploded view of FIG. 4. The heat gradients produced by heater layer 28 when energized are illustrated as a dot density in FIG. 3. In this embodiment, the solder layer 26 is hotter than the remainder of the module. Thus, the solder layer is heated more efficiently.

Figure 4:
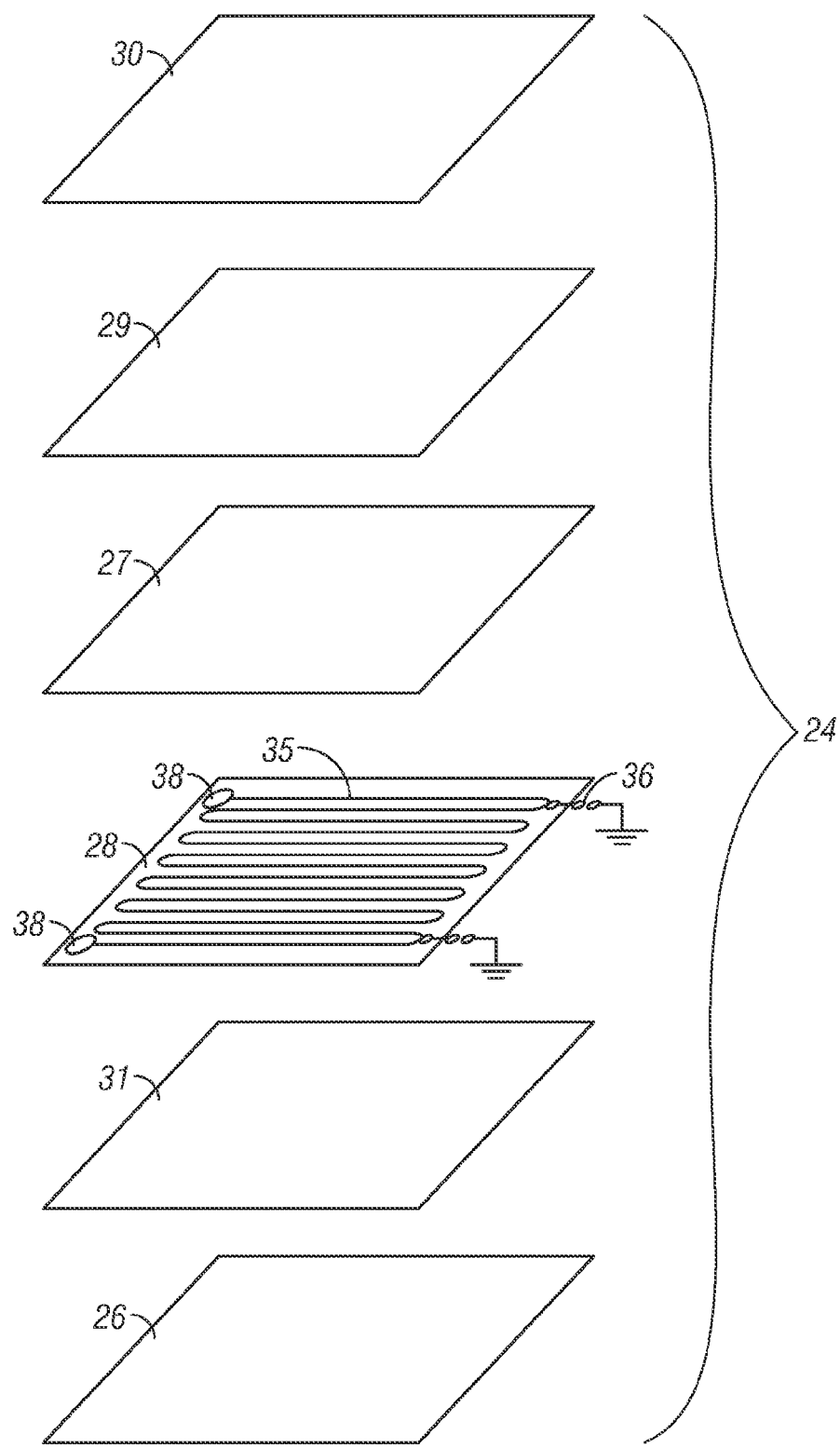
FIG. 4 is an exploded view of the layers in the multilayer carrier board of FIG. 3.
Figure 5:
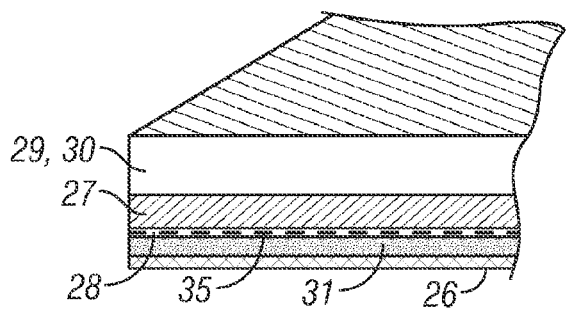
FIG. 5 is a broken away perspective view illustrating part of the assembled carrier board of FIG. 4.

FIG. 4 illustrates an exploded view of the layers of multi-layer printed circuit board in more detail, while FIG. 5 is a partial perspective view illustrating the assembled layers. In one embodiment, one of the layers is assigned as a heater layer during board design. The layers comprise a lower, solder layer 26, a heater layer 28 located above the solder layer with a first dielectric layer 31 between the heater and solder layers, a second, thicker dielectric layer 27 above the heater layer, a signal layer 29, and other layers 30 such as a power layer and a ground layer. A ground layer may be provided at any suitable location, either in the upper portion of the carrier board above dielectric layer 27, or the layer 26 may be a ground layer with a metallized lower surface of solder material.

The heater layer 28 in one embodiment is of dielectric material with a heater element 35 comprising a thin, elongate trace of highly conductive metal such as copper extending in a circuitous or meandering path across layer 28 to maximize its length so as to provide the necessary resistance. As illustrated in FIG. 4, the heater layer has a single, elongate metallic heater element or copper trace 35 arranged in a predetermined circuitous pattern across the entire area of the heater layer. The conductive metal trace is connected to a low voltage, high current power supply in order to provide the necessary amount of heat to melt the solder layer and allow the module to be attached to a host board and to be removed from a host board if the module is not functioning correctly. Use of copper for the heater layer is much less expensive than using high resistance exotic material such as tungsten, and is much easier to process than materials such as tungsten. Even though copper is a high conductivity, low resistance material, it can be used effectively as a heating element by applying a relatively thin copper trace in a tortuous or serpentine path across the heater layer, so as to increase or maximize its length, and connecting the trace to a high current, low voltage power supply. Other suitable high conductivity materials for the heater element are silver and gold, but copper is more desirable since it is less expensive and also commonly used in printed circuit board construction.

Figure 6A:
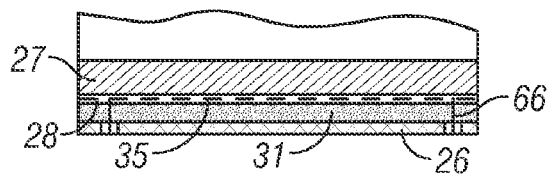
FIG. 6A is a cross-sectional view through the carrier board of FIGS. 4 and 5 illustrating two vias providing junctions to connect the heater element to a power supply.
Figure 6B:
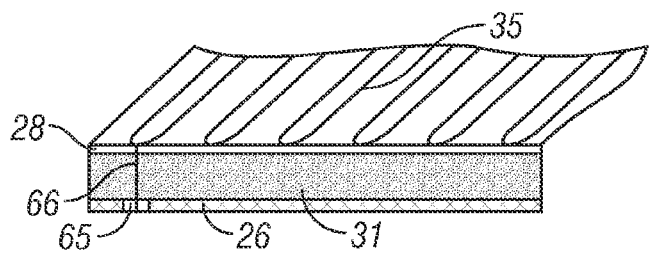
FIG. 6B is an enlarged view illustrating the heater layer and the layers below it, showing the via connection to the heater element in more detail.
Figure 6C:
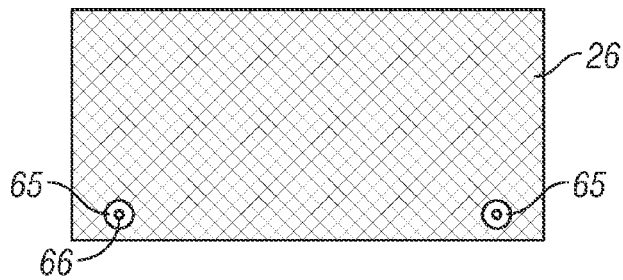
FIG. 6C is a bottom plan view of the carrier board of FIGS. 3 to 6B.

The heater element 35 has inputs 38 configured for connection to a power supply when needed for heating or to ground when the heater element is not in use. Inputs 38 may be provided by vias or castellations 65 which extend through dielectric layer 31 and through holes 66 in solder layer 26, as illustrated in FIGS. 6A to 6C and in FIG. 7. Alternatively, vias may extend through one or more layers of board 24 above the heater layer for selective connection to a ground layer or through the edge of the board to a power supply via suitable circuit traces in one of the upper layers.

Figure 7:
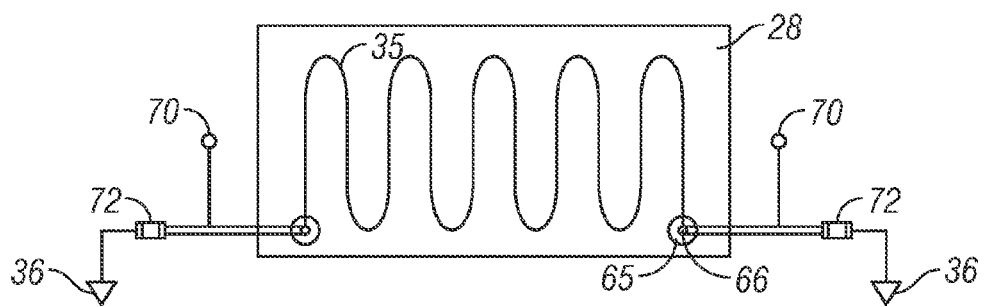
FIG. 7 is schematic illustration of one embodiment of the connection of the heater element to a power supply or ground.

Layer 28 may be of any suitable dielectric material. The heater layer is isolated from all other nodes except ground. As discussed above, the heater layer may be selectively connected to ground when not needed for heating purposes, via suitable connections between heater element 35 and a ground layer, such as connections 36 schematically illustrated in FIG. 4, and illustrated in more detail in FIG. 7. In one embodiment, a zero-ohm resistor bridge 72 may be used to by-pass each ground connection when the heater element is to be used for melting the solder layer, as illustrated in more detail in FIG. 7. FIG. 7 also illustrates connections 70 which may be provided at the edge of board 24, also through vias, to connect the heater element to a suitable power supply when it is to be used for heating purposes. Once the surface mount module 20 is installed and tested, the zero-ohm resistors may be removed to connect the heater element to ground if the module is functioning properly.

Figure 3:
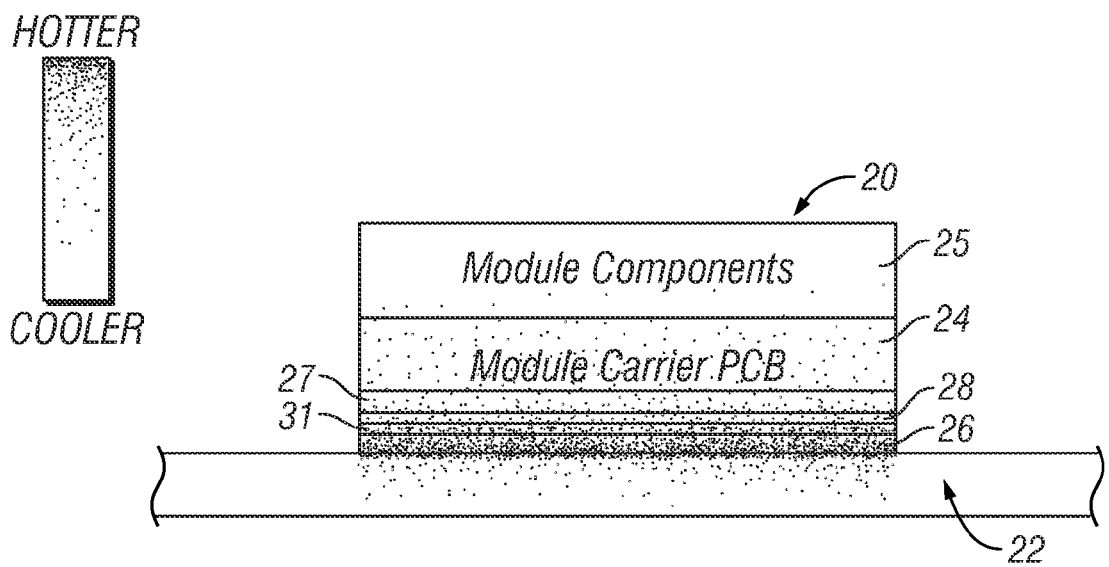
FIG. 3 is a side view of a first embodiment of a surface mount module having a carrier board with an integrated heater layer.

The dielectric layer 31 below the heater layer 28 is much thinner than the dielectric layer 27 above the heater layer, as illustrated in FIGS. 3, 5 and 6A. In one embodiment, layer 31 may be of around 0.003 to 0.006 inches, so as to allow heat to travel efficiently through layer 31 to the bottom metal or solder layer.

Figure 8:
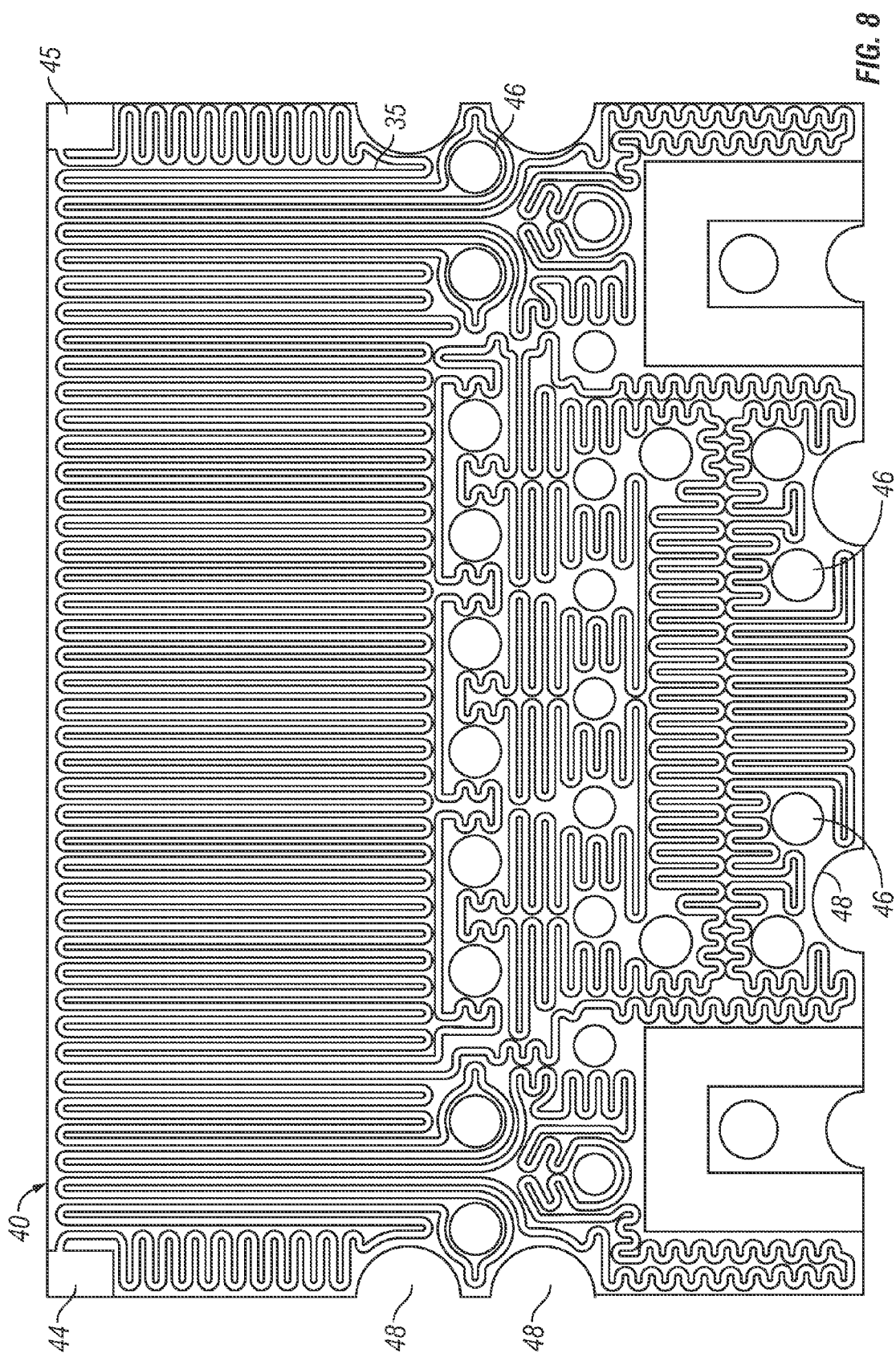
FIG. 8 is a top plan view of one embodiment of a circuitous or meandering heater element in a heater layer for incorporation in a multilayer surface mount module or carrier board.

Heater element 35 is arranged in a simple sinusoidal path in FIG. 4 for illustration purposes only, and the circuitous path of the heater element or copper trace is generally much more dense and fills more of the area of the heater layer. Numerous different, densely arranged, meandering or circuitous paths which are uniform or non-uniform may be selected to increase the length of element 35. In general, the length of the copper trace or element 35 is such that it dissipates thermal power when connected to a power supply. FIG. 8 illustrates one alternative embodiment of such a path. In FIG. 8, layer 40 is of dielectric material and has a conductive copper trace or heater element 35 extending across all available area of layer 40 in a circuitous or meandering pattern. Element 35 comprises a single trace which extends from input or connector 44 at one corner of the board to connector 45 at the opposite corner, and which includes a plurality of circuitous segments directed around various vias 46 in layer 40 to provide for connection and castellations 48 at layer edges between different layers of the board. The connectors 44, 45 may be contact pads, vias, or castellations, and may be selectively connected to a high current, low voltage power supply or to ground using a connection as illustrated in FIG. 7.

As illustrated in FIG. 8, the heater element is arranged in a suitable meandering or circuitous path which may include serpentine or non-serpentine sections. Any suitable circuitous path may be used for heater element 35, such as zig-zag, serpentine, sinusoidal, helical or other circuitous or meandering paths, or combinations thereof, to allow as much length as possible to be created in the heater layer. The longer the heater element trace, the higher the resistance of the heater element. Copper traces that are based on ½ ounce per square foot copper cladding produce 0.5 milliohms of resistance per "square" of area. In FIG. 8, the elongated trace has approximately 32 inches of length, and the traces are 0.004" wide. This means that every 0.004" of unit length produces 0.5 milliohms of resistance. The board was designed to be 0.5"× 0.750". The resulting DC resistance is 4.0 ohms, which is sufficient to allow the element to be energized with a reasonable current of approximately 2.25 A to produce 20 watts of thermal dissipation, or approximately 3.16 amperes to produce 40 watts of thermal dissipation. The resistance of the copper is higher at elevated temperatures. Copper traces based on ¼ oz or ½ oz. copper may be used to keep the resistance sufficiently high. The desired heater layer or zone wattage is also dependent on the type of solder, with high melting point solders and/or higher masses requiring a higher wattage. It can be instructive to remember that pencil-type soldering irons are typically between 20-40 watts.

It may take a relatively long time to heat and liquefy a solder layer starting at room temperature with around 10 watts of power. There are two possible heating methods or modes of operation for the arrangement of FIGS. 3 to 8. In a first, ambient method, the heater element is used to heat module 20 from ambient temperature to the solder reflow temperature. In a second, pre-heat or augmented heating method, the entire assembly (host board and associated modules and components) is heated in an oven to a non-damaging temperature which is sufficiently below the solder reflow temperature, for example to around 150 to 165° C., to avoid liquefying the solder attaching components and modules to the board. This temperature may be around 20 C-35 C degrees below the solder reflow temperature, for example. In one embodiment, the heater element is connected to the power supply to supply current to the element concurrently with heating of the remainder of the assembly in the oven. In an alternative embodiment, the assembly is pre-heated in the oven and the pre-heated assembly is then removed from the oven before connecting the heater element 35 to a high current, low voltage power supply. When heater element is energized, only a 20 to 35 degree rise in temperature is needed to reflow the solder layer 26, which occurs quickly. The component or module 20 may then be lifted off the board using tweezers or a fixture. The heater layer is then immediately de-energized, and the heater element may be connected to ground so that the heater layer acts as a ground layer for shielding when not in use.

The ambient method works in a similar way but is far slower than the oven heat augmented method, because the temperature needs to rise by a much larger amount to reflow the solder, for example a temperature rise of 160 degrees from ambient is needed in order to reflow SN63 solder.

Figure 9:
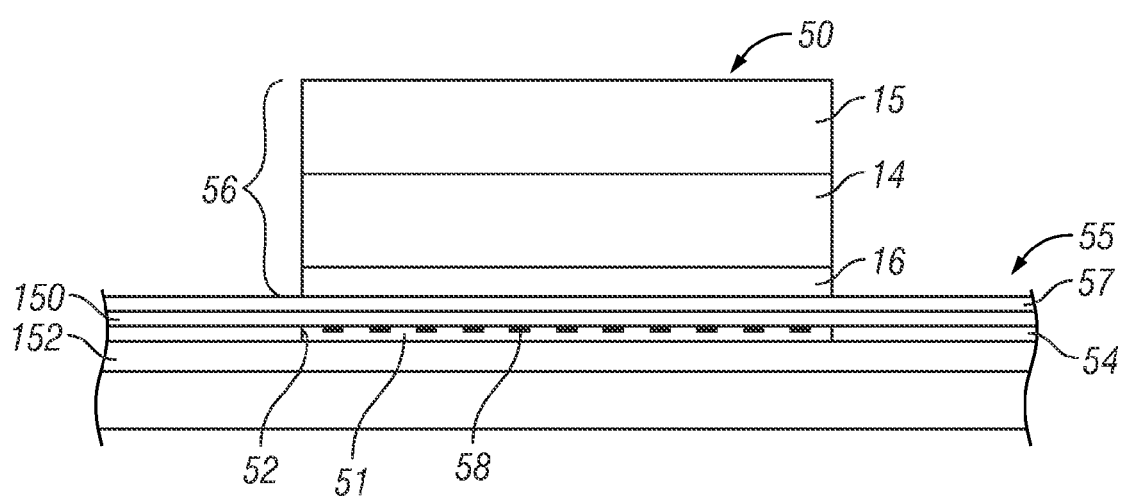
FIG. 9 is a side view of part of one embodiment of a host board of an electronics assembly incorporating an integrated heater layer.

FIGS. 9 and 10 illustrate an alternative embodiment of a surface mount assembly 50 in which heater zones 52 (FIG. 10) are provided in a heater layer 54 embedded in the host board 55. The heater zones are located such that each heater zone 52 is located directly underneath the solder layer 16 of a respective surface mount module 56 on the board, as illustrated for one module 50 in FIG. 9. The design of the host board 55 is arranged such that only a minimal thickness layer 150 of dielectric material is located between the upper layer 57 of host board 55 and the heater layer 54, so as to reduce the thermal impedance. Layer 150 may be of thickness between 0.003 and 0.006 inches, as in the carrier board embodiment of FIGS. 3 to 8. A second dielectric layer 152 thicker than layer 150 is located under heater layer 54. Typical surface mount modules 56 and other components (not illustrated) are mounted on the host board in a conventional manner.

In one embodiment, heater layer 54 is a ground layer comprising a dielectric base and a copper coating 53 on the upper surface of layer 54, as indicated in FIG. 10. The continuous copper coating is removed in selected zones 52 designated as heater zones, leaving a dielectric base 51 with a suitable copper trace or heater element 58 having a circuitous or meandering path in each zone 52, so as to increase the length of element 58 in order to provide the desired resistance. The heater element 58 in this embodiment is designed in the same way as the heater element 35 embedded in the carrier board of the previous embodiment so as to maximize trace length and resistance. Although the heater zones 52 are of approximately the same size and with the same heater element pattern in FIG. 10, they may be of different sizes with different heater element lengths and patterns in alternative embodiments, with the size, shape, and heater element of each heater zone 52 dependent on the characteristics of the module mounted over the heater zone.

Many heater zones 52 may be placed in a given host board in this way and positioned to heat predetermined components or modules on the board to allow removal if necessary. As illustrated in FIG. 9, the zones are embedded inside ground layer 54 of the host board and isolated from all other nodes except ground by dielectric layers 150, 152 on each side of layer 54. Each heater element 58 has its own inputs 60 for connection to a power supply, which may be routed to the edge of the layer for convenience, as illustrated in FIG. 10. Multi-point ground connections 62 to the metal ground layer or coating 53 surrounding each heater zone may also be provided, with suitable switches so that the element is isolated from ground when the heater zone is energized, and can be connected to ground if the heater zone is not needed or after use.

Each heater zone 52 is assigned to a selected element or module on the board which would be impractical to remove using standard techniques, for example to a relatively expensive or large size module, so as to reduce the risk of damage if the module needs to be removed for testing or repair. In this way, heater elements can be individually energized and the zone can be individually heated as needed to allow removal of the associated module or components from the board. This allows selected reflow of the components or modules in specific zones of a host board. As in the previous embodiment, an oven augmented or pre-heating method or an ambient method may be used for removing selected elements from the board.

In the above embodiments, a heat source for removing a module or component from a host board is placed within the carrier board of the module under the component carrier layer as in FIGS. 3 to 8 or embedded in the host board under the module as in FIGS. 9 and 10. Thus, rather than applying heat from above the module as in FIGS. 1 and 2, the module is heated by an embedded heater layer below the upper layers of the carrier board, and the electronics on top of the carrier board is the coolest part of the operation, instead of the hottest as is the case with the prior art method of FIGS. 1 and 2, as can be seen by comparing the dot densities of FIG. 2 and FIG. 3. This is a major advantage, since the solder layer is closer to the heat source than the electronics and is heated before the electronics. As soon as the solder reflows, the module or component is lifted off the board, undamaged. No superheating needs to occur, because the thermal impedance between the heat source and heat target (solder layer) is small, unlike the method of FIGS. 1 and 2, wherein the entire module is between the heat source and heat target and is heated to the solder reflow temperature. Similarly, the solder layer is closer to the heat source below the surface layer of the host board in the alternative embodiment of FIGS. 9 and 10, and the heat source is spaced even farther away from the electronics of the surface mount module in this embodiment.

In some cases, such as tall electronics modules and modules with outer housings, the heating method of the above embodiments is the only practical way to remove such modules, short of reflowing the entire board in an oven. In other installations, there is no metallized area surrounding the module at all. Instead, all metallization is hidden under the module, so use of an iron is not possible. The heating layer and heating zones of the above embodiments allow selected components and modules to be removed or reinstalled quickly and easily with significantly reduced risk of damage to the electronics. This is particularly useful in the case of very expensive SMT modules and host board assemblies, where the ability to qualify an inoperative module for warranty service, testing, or repair without destroying it by excessive heating on removal from a board is very important.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

I claim:

1. A printed circuit carrier board of a surface mount module, configured for soldering onto a larger host board, comprising:
   one or more upper layers, at least one upper layer carrying surface mound electronic components;
   a lower, solder interface layer comprising a metallized mounting plane configured for soldering on a host board;
   a heater layer embedded in the board between the upper and lower layers, the heater layer being closer to the lower layer than the upper layer;
   a first dielectric layer between the heater layer and solder interface layer;
   a second dielectric layer between the heater layer and said one or more upper layers;
   the heater layer having at least one elongated heater element of copper material, the heater element extending in a circuitous path across the entire area of the heater layer;
   a pair of inputs connected to the heater element and configured for connection to a high current, low voltage power supply; and
   the first dielectric layer being thinner than the second dielectric layer, whereby heat from the heater element is transferred through the first dielectric layer to the solder interface layer faster than through the second dielectric layer to the upper layers and the solder layer is heated to a solder reflow temperature before the one or more upper layers.

2. The carrier board of claim 1, wherein the first dielectric layer has a thickness in the range from about 0.003 inches to about 0.006 inches.

3. The carrier board of claim 1, wherein the copper heater element comprises a single, continuous copper trace having a length of at least thirty inches.

4. The carrier board of claim 3, wherein the copper heater element is configured to produce power of at least approximately 10 watts when connected to a three amp power supply.

5. The carrier board of claim 3, wherein the copper trace has a thickness of ¼ oz to ½ oz.

6. The carrier board of claim 5, wherein the copper trace has a width in the range from about 0.004 to about 0.005 inches.

7. The carrier board of claim 1, further comprising ground connection points configured for selective connection of the heater element to ground when not in use.

8. A method of removing a selected surface mount module from a host board of an electronics package assembly, comprising:
   energizing an elongate, copper trace heater element which is arranged in a circuitous path across at least part of the area of a heater layer embedded in the carrier board of a selected surface mount module, the heater layer being located in a lower portion of the carrier board at a predetermined first distance from a lower solder interface layer of the carrier board and a predetermined second distance from upper layers of the carrier board on which electronic components are surface mounted, the first distance being less than the second distance whereby the heater layer is closer to the solder interface layer than the surface mounted electronic components, the solder interface layer being soldered to the host board of an electronics package assembly;
   the step of energizing the heater element comprising connecting the element to a high current, low voltage power supply of at least three amps, whereby the power output of the heater element is at least ten watts;
   heating the lower solder interface layer of the surface mount module with the heater element to the reflow temperature of the solder material forming the solder interface layer, the one or more upper layers being at a lower temperature than the solder reflow temperature due to the larger distance of the one or more upper layers from the heater element;
   removing the surface mount module from the host board before the one or more upper layers reach the solder reflow temperature; and
   disconnecting the heater element from the power supply.

9. The method of claim 8, further comprising heating the entire electronics package assembly in an oven from ambient temperature to a first temperature lower than the solder reflow temperature prior to energizing the heater element embedded in the selected surface mount module to heat the lower solder interface layer of the surface mount module from the first temperature to the reflow temperature.

10. The method of claim 9, wherein the first temperature is approximately 20 degrees less than the solder reflow temperature.

11. The method of claim 8, further comprising connecting the heater element to a ground plane when not in use.

12. A surface mount technology (SMT) module, comprising:
   a printed circuit board (PCB) having multiple PCB layers including one or more upper layers and a lower, solder interface layer;
   a plurality of surface mounted electronic components carried by the one or more upper layers;
   the solder interface layer comprising a metallized mounting plane configured for soldering on a larger host board;
   a heater layer embedded in the PCB between the solder interface layer and the one or more upper layers, the heater layer being closer to the lower, solder interface layer than the one or more upper layers carrying surface mounted electronic components;
   a first dielectric layer between the heater layer and solder interface layer;
   a second dielectric layer between the heater layer and said one or more upper layers;
   the heater layer having a single elongated heater element of copper material, the heater element extending in a continuous circuitous path across the entire area of the heater layer; and
   a pair of inputs connected to the heater elements and configured for connection to a high current, low voltage power supply.

* * * * *